United States Patent
Arrington et al.

(10) Patent No.: US 6,586,683 B2
(45) Date of Patent: Jul. 1, 2003

(54) PRINTED CIRCUIT BOARD WITH MIXED METALLURGY PADS AND METHOD OF FABRICATION

(75) Inventors: Edward L. Arrington, Owego, NY (US); Anilkumar C. Bhatt, Johnson City, NY (US); Edmond O. Fey, Vestal, NY (US); Kevin T. Knadle, Endicott, NY (US); John J. Konrad, Endicott, NY (US); Joseph A. Kotylo, Binghamton, NY (US); Jeffrey McKeveny, Endicott, NY (US); Jose A. Rios, Binghamton, NY (US); Amit K. Sarkhel, Endicott, NY (US); Andrew M. Seman, Kirkwood, NY (US); Timothy L. Wells, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 09/844,814

(22) Filed: Apr. 27, 2001

(65) Prior Publication Data
US 2002/0157861 A1 Oct. 31, 2002

(51) Int. Cl.⁷ ................................................ H05K 1/03
(52) U.S. Cl. .................. 174/255; 174/257; 174/261; 361/772; 361/777; 257/737
(58) Field of Search ........................... 174/255, 256, 174/261, 262, 263, 264, 265, 266; 361/757, 772, 774, 777, 778, 779; 257/737, 738, 690, 750

(56) References Cited

U.S. PATENT DOCUMENTS

| | | | |
|---|---|---|---|
| 3,854,973 A | * | 12/1974 | Mersereau et al. |
| 3,929,483 A | * | 12/1975 | Wainer et al. |
| 3,931,454 A | * | 1/1976 | Sprengling .................. 174/254 |
| 4,006,047 A | | 2/1977 | Brummett et al. |
| 4,104,111 A | * | 8/1978 | Mack .......................... 216/18 |
| 4,424,409 A | * | 1/1984 | Kuttner ....................... 174/257 |
| 4,434,544 A | * | 3/1984 | Dohya et al. ................. 216/13 |
| 4,572,925 A | | 2/1986 | Scarlett |
| 4,710,592 A | * | 12/1987 | Kimbara ..................... 174/262 |
| 4,944,850 A | | 7/1990 | Dion |
| 5,032,694 A | * | 7/1991 | Ishihara et al. ............. 174/256 |
| 5,041,700 A | | 8/1991 | Iyogi et al. |
| 5,414,221 A | * | 5/1995 | Gardner ...................... 174/261 |
| 5,474,798 A | | 12/1995 | Larson et al. |
| 5,606,198 A | * | 2/1997 | Ono et al. ................... 257/666 |
| 5,680,701 A | | 10/1997 | Sippel |
| 5,733,599 A | | 3/1998 | Ferrier et al. |
| 5,799,393 A | | 9/1998 | Backasch et al. |
| 5,910,644 A | | 6/1999 | Goodman et al. |
| 5,973,932 A | * | 10/1999 | Nguyen ...................... 361/779 |
| 6,022,466 A | | 2/2000 | Tamarkin et al. |
| 6,044,550 A | | 4/2000 | Larson |
| 6,378,199 B1 | * | 4/2002 | Yoshinuma et al. .......... 29/830 |

* cited by examiner

Primary Examiner—David L. Talbott
Assistant Examiner—José H. Alcala
(74) Attorney, Agent, or Firm—Schmeiser, Olsen & Watts; Lawrence R. Fraley

(57) ABSTRACT

A method of fabricating a printed circuit device including an electrically insulating substrate, and first, second, and third sets of conductors formed on a top surface of the substrate is disclosed. The method includes forming an oxide layer on the set of second conductors; forming a solder mask on the oxide layer; forming a composite layer on the first set of conductors; and forming a solder layer on at least a portion of the third set of conductors.

15 Claims, 7 Drawing Sheets

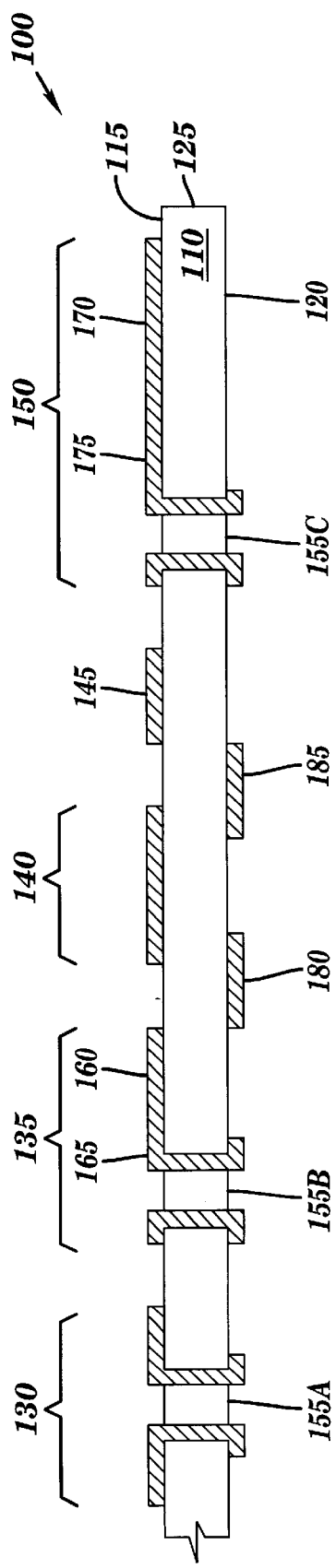
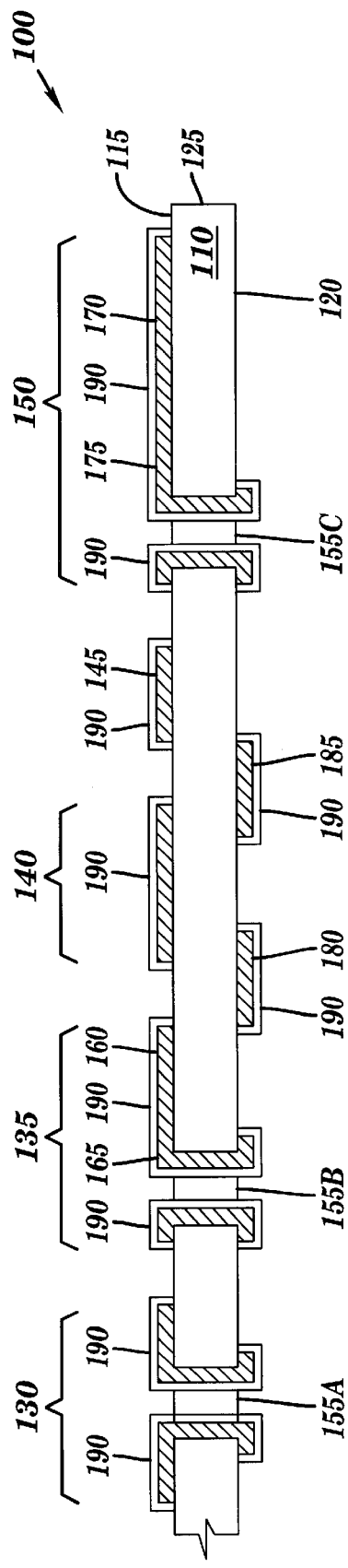

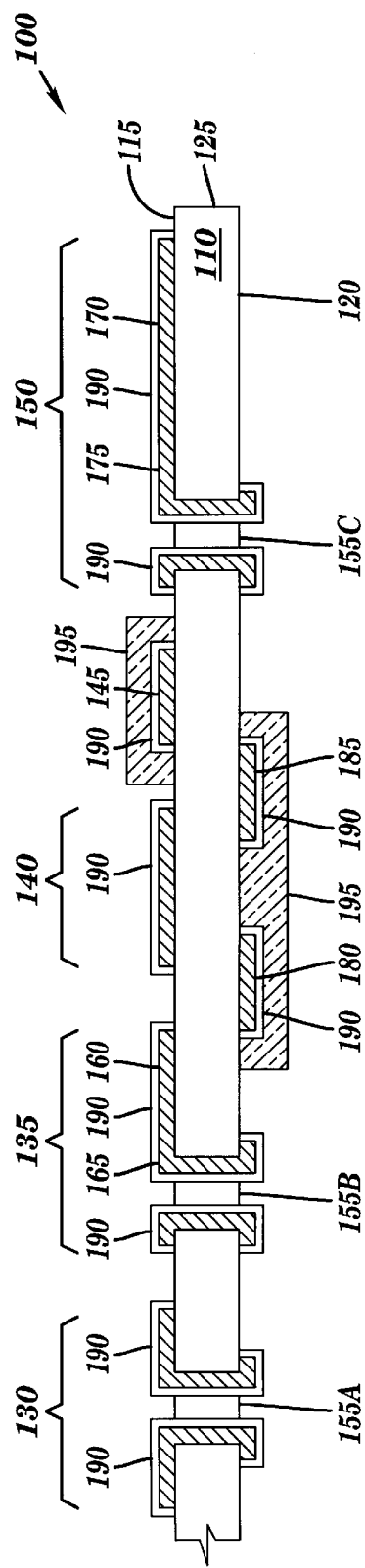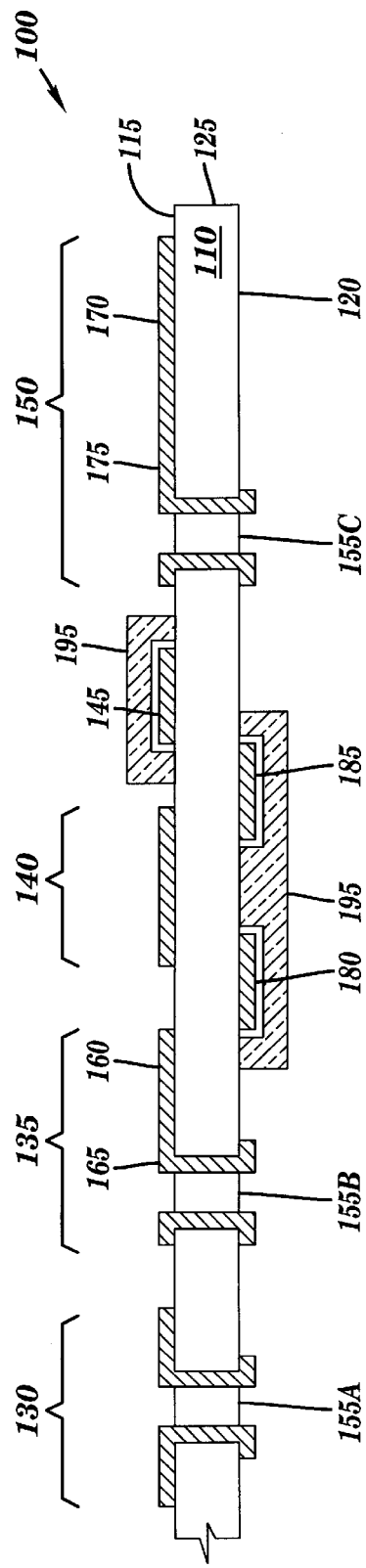

PRINTED CIRCUIT BOARD WITH MIXED METALLURGY PADS AND METHOD OF FABRICATION

FIELD OF THE INVENTION

The present invention relates to the field of printed circuit boards; more specifically, it relates to electronic devices connection pads and mechanical connectors for printed circuit boards and the method of fabricating the pads and connectors.

BACKGROUND OF THE INVENTION

Printed circuit boards (PCB's) serve the purpose of an intermediate level of packaging for attachment and electrical inter-connection of discrete devices such as resistors and capacitors and active devices such as logic and memory modules. Printed circuit board may also have edge connectors for physical attachment and electrical connection of the printed circuit board to a higher level of packaging. Devices are attached to printed circuit boards by a variety of methods. One attachment method is soldering to pads of discrete passive surface mount technology (SMT) components or active device ball grid array (BGA) or land grid array (LGA) modules. Another attachment method is pin in hole (PIH) soldering. PIH soldering requires printed circuit having plated through holes (PTH's). The pads and edge connectors are interconnected by wiring traces formed on the top surface of the printed circuit board. Often wiring traces are formed on the bottom surface of the board and within the board itself. Similarly, devices may be mounted on both the top and bottom surfaces of the printed circuit board.

Pads for SMT, BGA, LGA, and PIH/LGA solder connections require surface finish layers that provide good solderability and corrosion resistance. Edge connectors require surface finish layers for good electrical and mechanical contact, wear resistance, and corrosion resistance. Wiring traces must be protected from solder operations, often by a solder mask. The solder mask must have good adhesion to the wiring trace, requiring a application of a surface finish or surface treatment of the wiring trace.

Generally it is not possible for one surface finish to satisfy all the requirements thus placed on the printed circuit board so multiple surface finishes and/or surface treatments are required. Often multiple finishes require multiple masking steps. When multiple surface finishes or treatments are applied to a printed circuit board compatibility of the processes employed to produce those finishes is critical. For example, the chemicals used to remove masks should not corrode or contaminate any prior formed surface finishes. Similarly, the processes used to form a given surface finish should not corrode or contaminate other surface finishes or printed circuit board features.

SUMMARY OF THE INVENTION

A first aspect of the present invention is a method of fabricating a printed circuit device including an electrically insulating substrate, and first, second, and third sets of conductors formed on a top surface of the substrate. The method includes: forming an oxide layer on the set of second copper conductors; forming a solder mask on the oxide layer; forming a composite layer on the first set of conductors; and forming a lead-tin layer on at least a portion of the third set of conductors.

A second aspect of the present invention is a method of fabricating a printed circuit device including an electrically insulating substrate, and first, second, and third sets of conductors formed on a top surface of the substrate. The method includes: forming an oxide layer on the first, second and third sets of second conductors; forming a solder mask over the oxide layer on the second set of conductors; removing the oxide layer from the first and third sets of conductors; forming a first masking layer over the second and third sets of conductors; forming a composite layer on the first set of conductors; removing the first masking layer; forming a second masking layer over the first and second sets of copper conductors; and forming a solder layer on at least a portion of the third set of conductors.

A third aspect of the present invention is a printed circuit device including an electrically insulating substrate; first, second, and third sets of conductors formed on a top surface of the substrate; an oxide layer on the set of second conductors; a solder mask on the oxide layer; a composite layer on the first set of conductors; and a solder layer on at least a portion of the third set of conductors.

A fourth aspect of the present invention is a method of improving the adhesion of a protective layer over a conductive circuit feature during fabrication of a printed circuit device comprising: providing a substrate with conductive circuit features thereon; forming an oxide layer over at least a portion of the conductive circuit features, the oxide layer providing enhanced adhesion for a protective layer; applying the protective layer over the oxide layer over at least a portion of the conductive features; selectively removing portions of the protective layer to expose select regions of the oxide layer over the at least a portion of the conductive circuit features; removing the oxide layer in the exposed regions; and electroless plating a first conductive layer in the select regions of exposed the oxide layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1–6 show a sequence of partial cross section views illustrating initial process steps for fabricating a PCB according to the present invention;

DETAILED DESCRIPTION OF THE INVENTION

Figure 5:
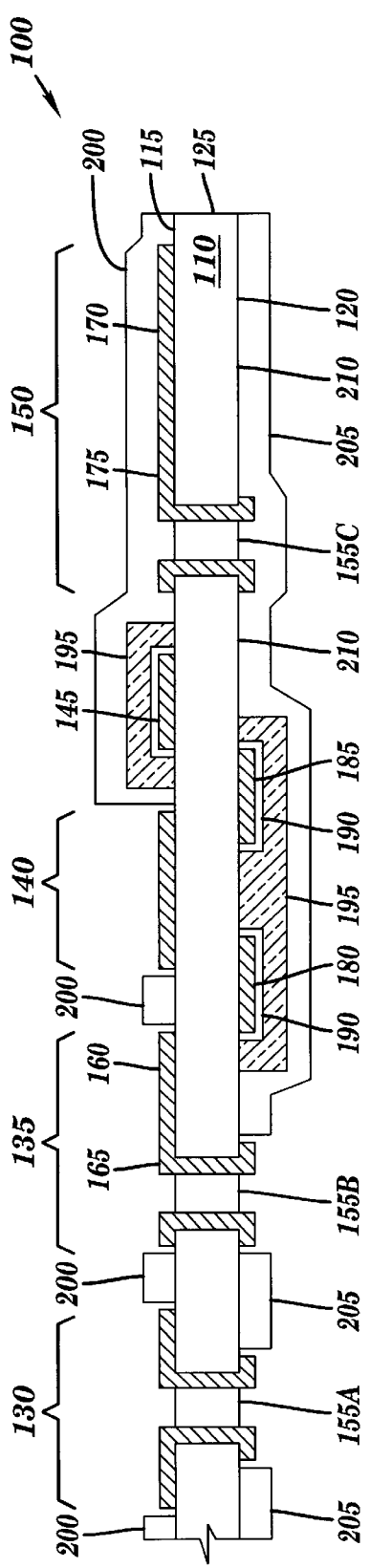

Referring to the drawings, FIGS. 1–6 show a sequence of partial cross section views illustrating initial process steps for fabricating a PCB according to the present invention. The process sequence starts with the structure illustrated in FIG. 1. In FIG. 1, PCB 100 includes a substrate 110 having a top surface 115, a bottom surface 120 and a substrate edge 125. In one example, substrate 110 is an insulating organic laminate board. In a second example, substrate 110 is a multi-layer organic laminate board having one or more internal wiring levels between layers of laminate. In a third example, substrate 110 is a ceramic substrate. In a fourth example, substrate 110 is a multi-layer ceramic substrate having one or more internal wiring levels between layers of ceramic material. In a fifth example, substrate 110 is a flexible insulating polymer. Formed from copper on top surface 115 of substrate 110 is a PIH LGA pad 130, a LGA Pad 135, an SMT pad 140, a top wiring trace 145, and an edge connector 150. Also formed in PCB 100 are PTH's 155A, 155B and 155C. PTH 155A is formed within PIH LGA pad 130. LGA pad 135 includes a pad portion 160 connected to PTH 155B by connecting portion 165. Edge connector 150 includes a terminal end 170 located near substrate edge 125, connected to PTH 155C by a connecting portion 175. Optionally, formed from copper on bottom surface 120 of substrate 115 are bottom wiring traces 180 and 185. It is also possible to form LGA pads, SMT pads, and edge connectors on bottom surface 120 of substrate 115.

In FIG. 2, PCB 100 is treated with an aqueous oxidizing solution to form a copper oxide layer 190 on all exposed copper surfaces including PIH LGA pad 130, LGA Pad 135, SMT pad 140, top wiring trace 145, edge connector 150 and bottom wiring traces 180 and 185. In one example, the oxidizing solution comprises about 10.0 to 14.1 grams of sodium hypochlorite and about 3.5 to 4.3 grams of sodium hydroxide in 100 milliliters of water. Copper oxide layer 190 has a weight per unit area of about 20 to 100 milligram/cm$^2$. In one example, copper oxide layer 190 is cuprous oxide. The purpose of copper oxide layer will be discussed below.

In FIG. 3, solder mask 195 is applied on copper oxide layer 190 on top wiring trace 145 and bottom wiring traces 180 and 185. In one example, solder mask 195 is applied by a top and bottom screen coating, followed by lithographic expose and develop processes. In one example, solder mask 195 is PSR4000 manufactured by Taiyo America Inc., Carson City Nev. and is about 200 to 1200 microinches in thickness.

In FIG. 4, copper oxide layer 190 not protected by solder mask 195 is removed. That is, copper oxide layer 190 is removed from PIH LGA pad 130, LGA Pad 135, SMT pad 140, and edge connector 150. In one example, copper oxide layer 190 is removed using a first solution of sulfamic acid and a second solution of sodium persulfate and sulfuric acid. The first solution comprises about 5 to 15 grams of sulfamic acid in 1000 milliliters of water. The second solution comprises about 35 to 45 grams of sodium persulfate and about 4 to 6 grams of sulfuric acid in 1000 milliliters of water.

In FIG. 5, upper first resist layer 200 is formed over top wiring trace 145 and edge connector 150. Upper first resist layer is also formed on top surface 115 of substrate 110 between PIH LGA pad 130, LGA PAD 135 and SMT pad 140. Lower first resist layer 205 is formed over bottom wiring traces 180 and 185. Lower first resist layer 205 is also formed between PTH's 155A and 155B and over PTH 155C as well as exposed regions 210 of lower surface 120 of substrate 110. In one example, upper first resist layer 200 and lower first resist layer 205 are formed by a vacuum application coating followed by a lithographic expose, develop and UV harden processes. In one example, upper first resist layer 200 and lower first resist layer 205 are Morton 5000 series manufactured by Morton Thiokol, Tustin, Calif. and are about 1000 to 4000 microinches in thickness.

Figure 6:
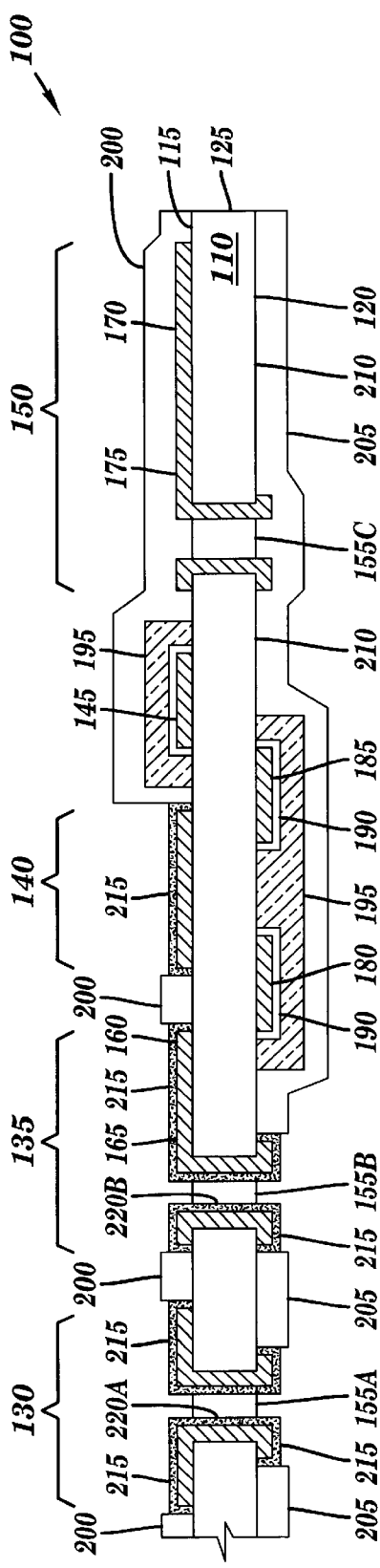

In FIG. 6, a composite layer 215 is formed on PIH LGA pad 130, LGA Pad 135, and SMT pad 140 by multiple sequential plating processes using upper first resist layer 200 and lower first resist layer 205 as a selective plating mask. Composite layer 215 is formed on all exposed copper surfaces including sidewalls 220A and 220B of PTH's 155A and 155B respectively. The formation of composite layer 215 is illustrated in FIGS. 7 and 8 and described below.

Figure 7:
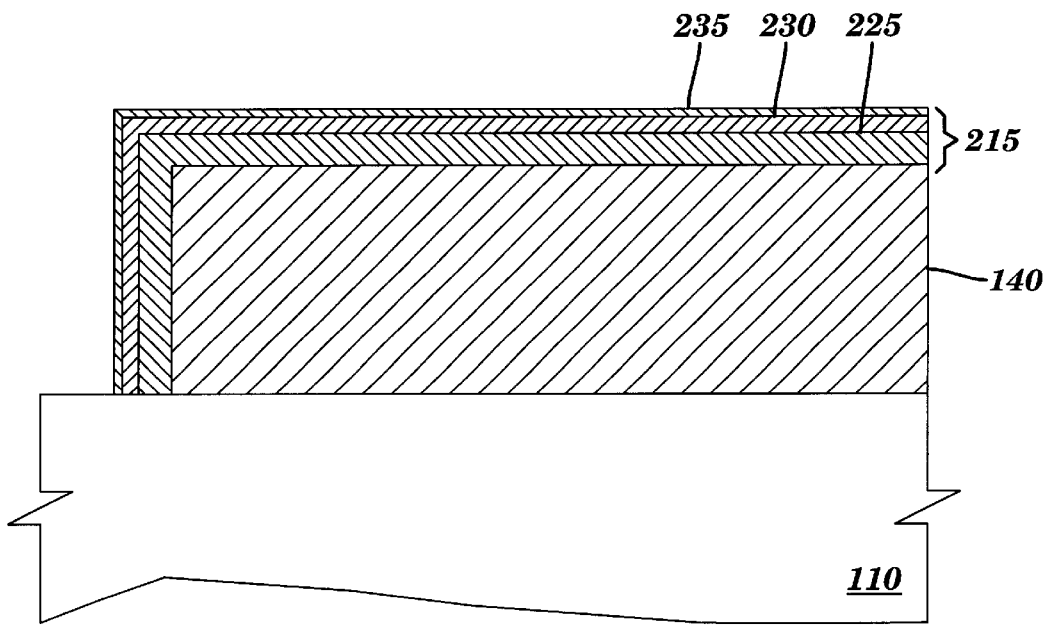
FIG. 7 shows a partial cross section view illustrating a tri-layer metallurgy for the composite layer formed in FIG. 6 according to the present invention.

FIG. 7 shows a partial cross section view illustrating a tri-layer metallurgy for the composite layer formed in FIG. 6 according to the present invention. Composite layer 215 is illustrated formed on SMT pad 140, but it is understood that the composite layer is also formed on PIH LGA pad 130 and LGA pad 135 as well. In FIG. 7, composite layer 215 includes a nickel layer 225 on SMT pad 140, a palladium layer 230 on top of the nickel layer, and a gold layer 235 on top of the palladium layer. Nickel layer 225 is about 50 to 300 microinches in thickness. Nickel layer 225 is formed by electroless plating. Electrolytic plating may be used whenever electroless plating is indicated. Nickel layer 225 acts as a copper diffusion barrier. Palladium layer 230 is about 4 to 30 microinches in thickness. Palladium layer 230 is formed by electroless plating. Palladium layer 230 acts as a wear resistance layer as well as forming a corrosion resistant surface. Gold layer 235 is about 1 to 10 microinches in thickness. Gold layer 235 is formed by electrolytic or electroless plating. Gold layer 235 enhances solderability and seals palladium layer 230 to prevent the palladium from attracting hydrocarbons that could form a contaminant film. In one example palladium layer 230 is 99.9% pure, fine grained, equiaxed and possesses a hardness of about HK25 200–250 (Knoop hardness scale), while gold layer 235 is soft gold. Soft gold is 99.9% pure gold with limitations on the type and quantity of impurities that are present in the remaining 0.1% of the material.

Copper oxide layer 190 prevents blister formation between certain conductive circuit features and solder mask 195, as for example, between lower wiring traces 180 and 185 and solder mask 195 as illustrated in FIG. 6 and described above. Copper oxide layer 190 also acts as an adhesion promoter between solder mask 195 and lower wiring traces 180 and 185. For example, solder mask adhesion is of concern in electroless nickel plating baths due to the relativity high temperature reached by the bath and the volume of hydrogen gas evolved during the plating operation. Lifting of the solder mask 195 may cause shorting problems during further card assembly processes. Another concern is blistering (formation of gas bubbles between the solder mask and a conductive circuit feature) of the solder mask away from the conductive circuit features if the conductive circuit features are not treated with a protective layer. Copper oxide layer 190 addresses both these concerns. In contrast to pattern plating precesses, the current invention provides for a conductive circuit feature, in this case, a copper surface treatment before surface finish operations such as lead-tin solder application or palladium plating are performed. To attempt to perform a copper surface treatment after the tin-lead solder has been applied, would be problematic because of the tendency of the copper surface treatment to attack the tin-lead during processes.

Figure 8:
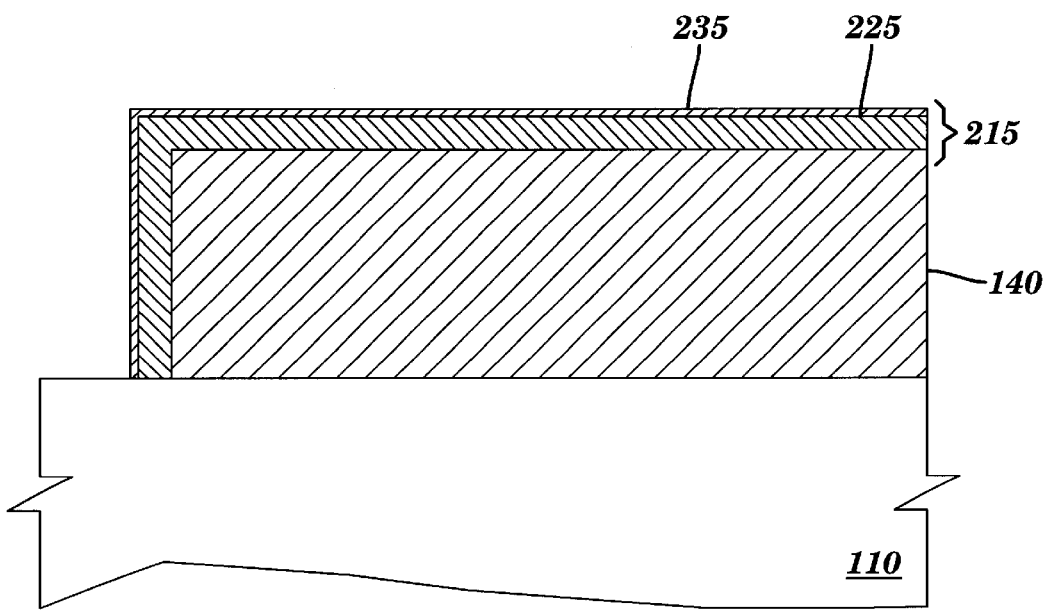
FIG. 8 shows a partial cross section view illustrating a bi-layer metallurgy for the composite layer formed in FIG. 6 according to the present invention.

FIG. 8 is shows a partial cross section view illustrating a bi-layer metallurgy for the composite layer formed in FIG. 6 according to the present invention. In FIG. 8, composite layer 215 includes a nickel layer 225 on SMT pad 140 and a gold layer 235 on top of the nickel layer. Nickel layer 225 is about 50 to 300 microinches in thickness. Nickel layer 225 is formed by electroless plating. Nickel layer 225 acts as a copper diffusion barrier. Gold layer 235 is about 20 to 40 microinches in thickness. Gold layer 235 is formed by electrolytic or electroless plating. Gold layer 235 enhances solderability and acts as a wear resistant layer. In one example, gold layer 235 is hard gold. Hard gold is at least 99.9% pure gold alloyed with up to 1000 parts per million of 99.0% cobalt and/or nickel to give the alloy a hardness of about HK25 130–260 (Knoop hardness scale).

Returning to FIG. 7, alternatively, composite layer 215 includes a nickel layer 225 a hard gold layer 230 on top of the nickel layer, and a soft gold layer 235 on top of the hard gold layer. Nickel layer 225 is about 50 to 300 microinches in thickness. Nickel layer 225 is formed by electrolytic plating. Nickel layer 225 acts as a copper diffusion barrier. Hard gold layer 230 is about 20 to 40 microinches in thickness. Hard gold layer 230 is formed by electroless plating. Hard layer 230 acts as a wear resistant layer. Soft gold layer 235 is about 5 to 30 microinches in thickness. Soft gold layer 235 is formed by electrolytic or electroless plating. The combined thickness of hard gold layer 230 and soft gold layer 235 should not exceed 55 microinches.

Figure 9:
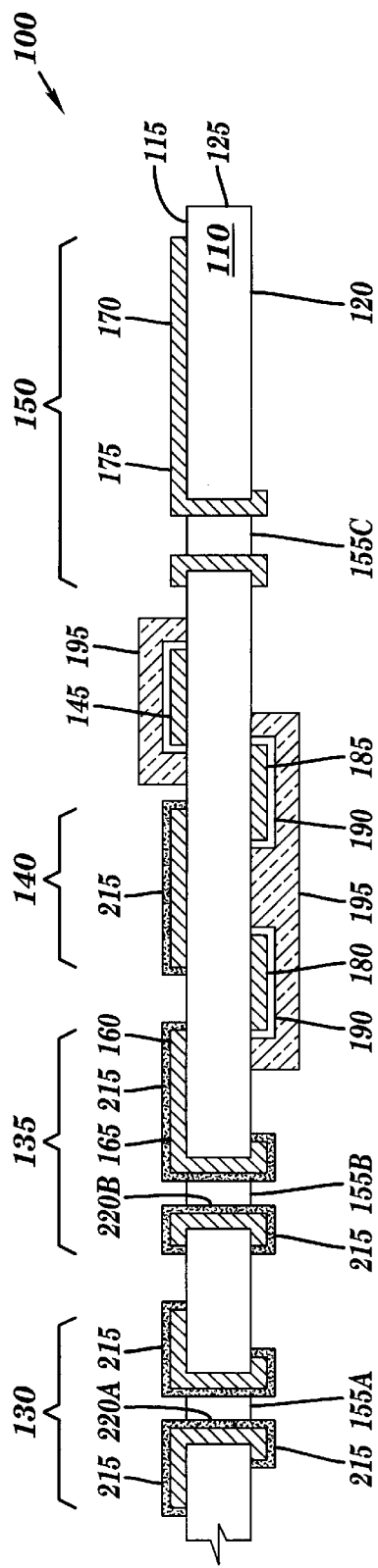
FIGS. 9–12 show a sequence of partial cross section views illustrating further process steps for fabricating the PCB according to the present invention.

Returning to the process flow, FIGS. 9–12 show a sequence of partial cross section views illustrating further process steps for fabricating the PCB according to the present invention. In FIG. 9 upper first resist layer 200 and lower first resist layer 205 have been removed using benzyl alcohol. Benzyl alcohol is used because it eliminates the possibility of galvanic corrosion between copper and non-copper metallic features (for example, formation of corrosion pits) or Silvering (undercut of precious metal ans/or subsequent flaking causing shorts). Sodium or potassium hydroxide provide the strong electrolytes to promote the galvanic cell reactions. Halogonated organic resist strippers/removers are undesirable because of environmental concerns.

Figure 10:
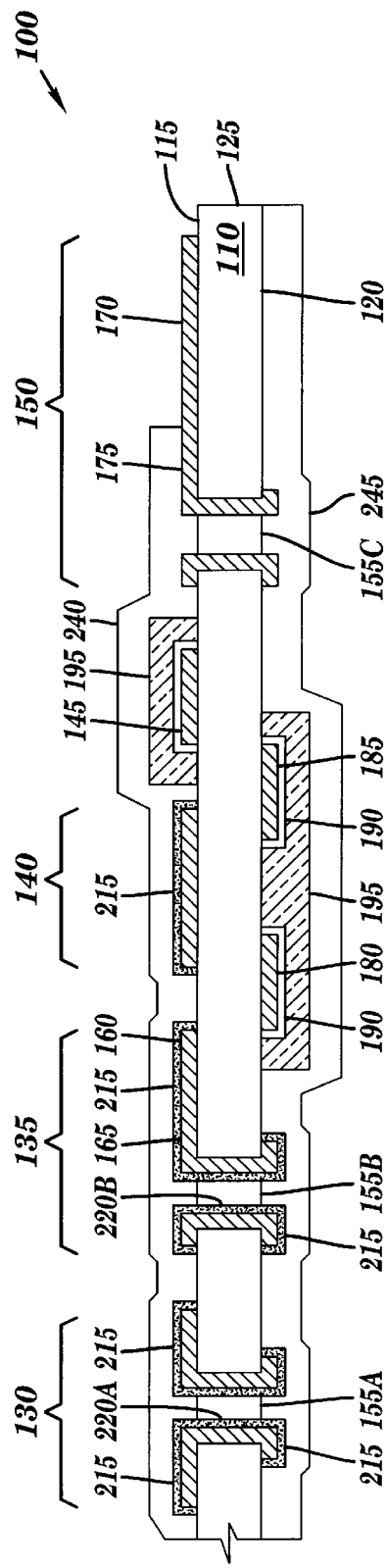

In FIG. 10, upper second resist layer 240 is formed over the entire top surface 115 of substrate 110 and all structures on the top surface of the substrate except for terminal end 170 of edge connector 150 which is left exposed. Lower second resist layer 245 is formed over the entire bottom surface 120 of substrate 110 and all structures on the bottom surface of the substrate. In one example, upper second resist layer 240 and lower first resist layer 245 are formed by a vacuum coating followed by a lithographic expose, develop bake processes. In one example, upper second resist layer 240 and lower second resist layer 245 are Morton 5000 series manufactured by Morton Thiokol, Tustin, Calif. and are about 1000 to 4000 microinches in thickness.

Figure 11:
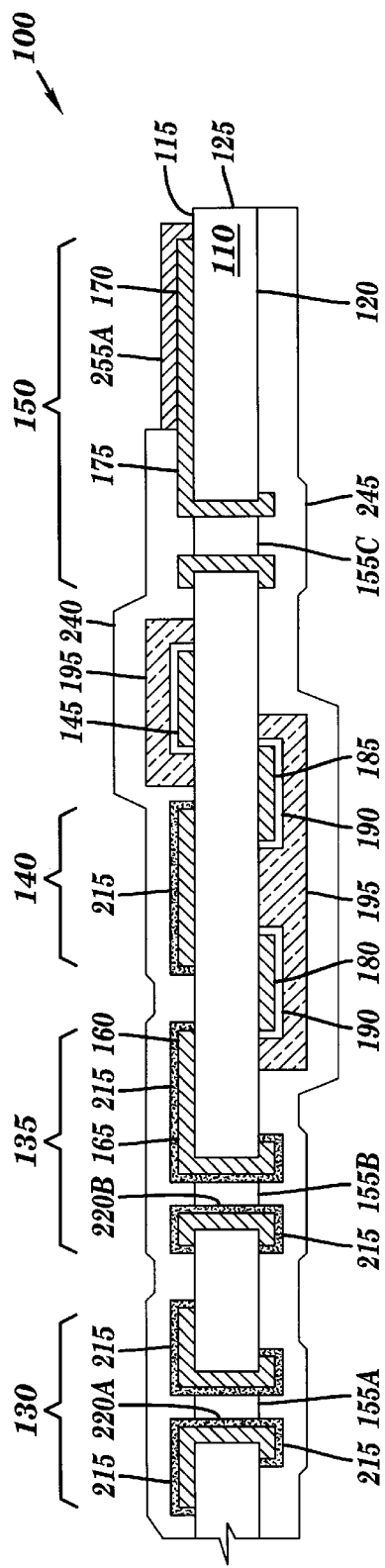

In FIG. 11, lead-tin layer 255A has been formed on terminal end 170 of edge connector 150 by electrolytic plating, using upper second resist layer 240 and lower first resist layer 245 as plating masks. Lead-tin layer 255A is about 100 to 1000 microinches in thickness. Lead-tin layer 255A is comprised of about 50 to 70 percent tin. The balance of lead-tin layer 255A is lead. Alternatively, a layer of tin about 3 to 15 microinches in may be formed by electrolytic plating on terminal end 170 first, followed by plating of lead-tin layer 255A second.

Figure 12:
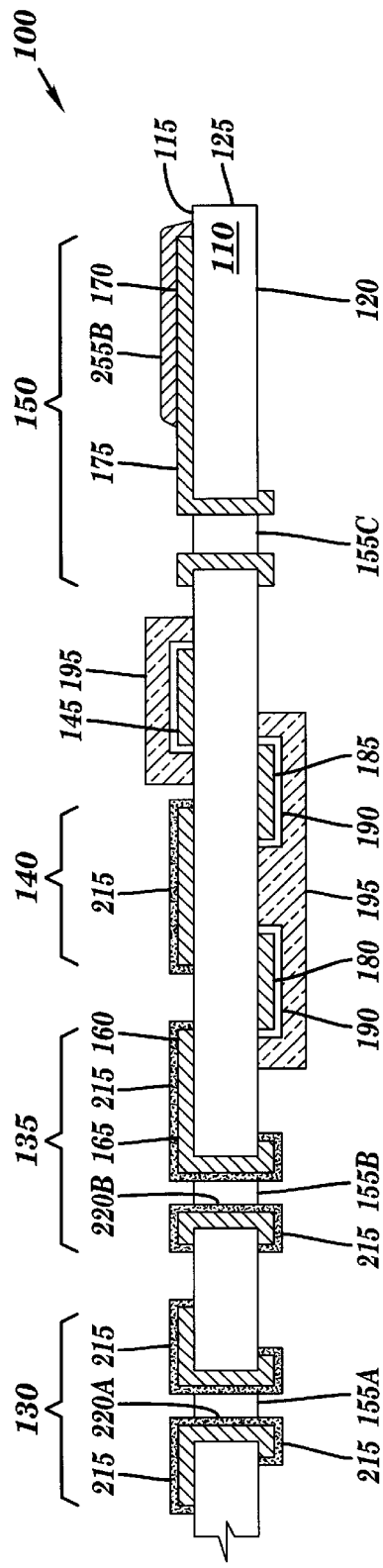

In FIG. 12, upper second resist layer 240 and lower second resist layer 245 have been removed using benzyl alcohol as described above. Lead-tin layer 255A has been reflowed to produce reflowed lead-tin layer 255B.

Figure 13:
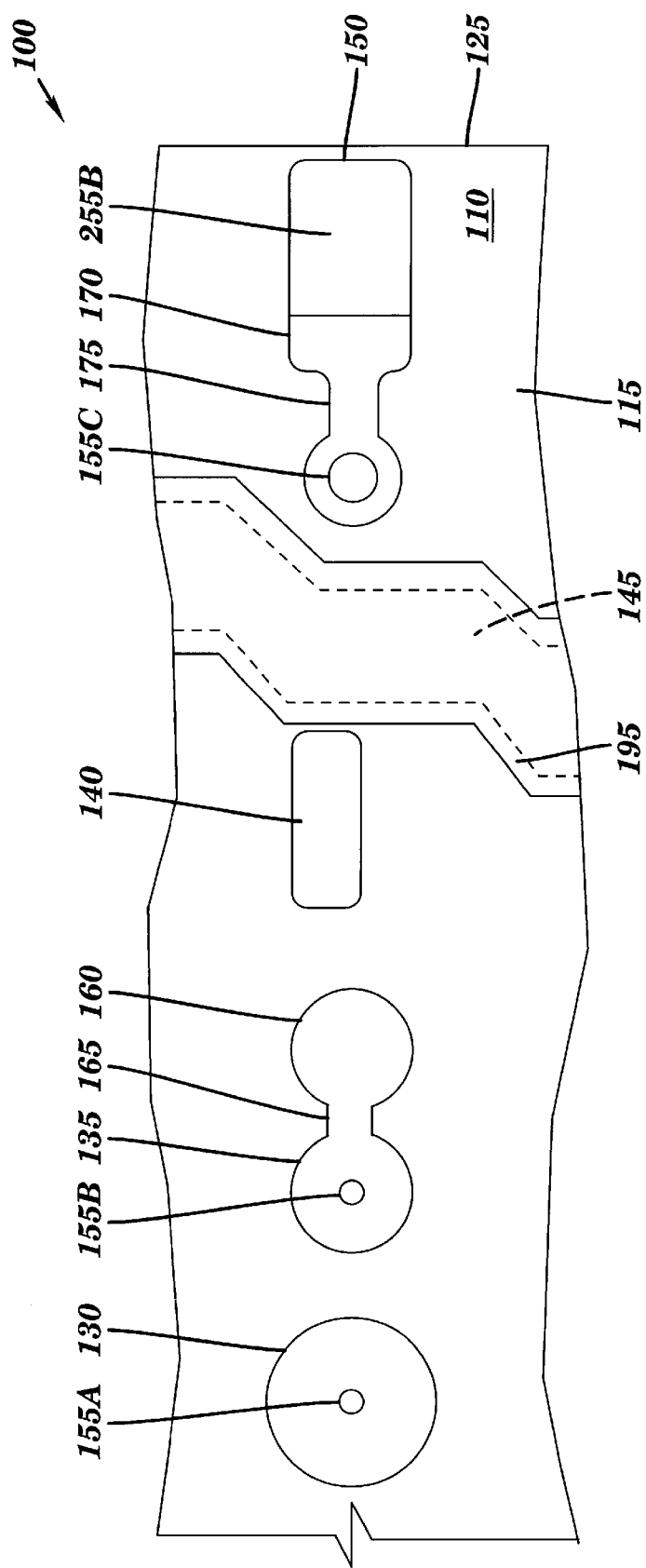
FIG. 13 is a partial top view of the PCB fabricated according to the present invention.

FIG. 13 is a partial top view of the PCB fabricated according to the present invention. In FIG. 13, PIH LGA pad 130, LGA Pad 135, SMT pad 140, top wiring trace 145 and edge connector 150 are illustrated. PTH 155A is formed within PIH LGA pad 130. LGA pad 135 includes a pad portion 160 connected to PTH 155B by connecting portion 165. Top wiring trace 145 is coated with solder mask 195. Edge connector 150 includes a terminal end 170 connected to PTH 155C by a connecting portion 175. Terminal end 170 is covered with reflowed lead-tin layer 255B.

While the discussion has used various materials as examples of how to practice the invention it is understood that other materials can be utilized. For example the circuitized features on the substrate can be copper and its alloys, aluminum and its alloys as well as other metallic conductors. The described oxide layer can be of various oxides of non-noble metals. For example the oxide layer my be oxides of copper, oxides of copper alloys, oxides of aluminum, oxides of aluminum alloys, or oxides of other non-noble metals. The metal component(s) of the oxide layer material can be different from that of the base circuit feature material. Oxides of aluminum could be used over copper for example. While lead-tin solder was used in the description of the invention, it is also understood that any alloy solder can be used. Examples of such solders include eutectic lead-tin solders, high melt lead-tin solders and lead free solders. Various solder mask materials can be used to form the resist layer such as permanent resist, aqueous developed polymeric layers, and non-aqueous developed polymeric layers.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. For example, BGA devices may be substituted for LGA devices. Therefore, it is intended that the following claims cover all such modifications and changes as fall within the true spirit and scope of the invention.

What is claimed is:

1. A printed circuit device comprising:

an insulating substrate;

first, second, and third sets of conductors formed on a top surface of said substrate;

an oxide layer on said set of second conductors;

a solder mask on said oxide layer;

a composite layer on said first set of conductors; and a solder layer on at least a portion of said third set of conductors.

2. The printed circuit device according to claim 1, wherein said conductors are selected from the group consisting of copper, aluminum, copper alloy, and aluminum alloy.

3. The printed circuit device according to claim 1, wherein said solder is selected from the group consisting of eutectic tin lead, high melt tin lead alloys, and lead free alloys.

4. The printed circuit device according to claim 1, wherein said oxide layer is selected from the group consisting of copper, aluminum, copper alloys, aluminum alloys, and non-noble metals.

5. The printed circuit device according to claim 1, wherein said composite layer comprises a layer of nickel, a layer of palladium overlaying said layer of nickel and a gold layer overlaying said layer of palladium.

6. The printed circuit device according to claim 1, wherein said composite layer comprises a layer of nickel and a layer of gold overlaying said layer of nickel.

7. The printed circuit device according to claim 1, wherein said composite layer comprises a layer of nickel, a first layer of gold overlaying said layer of nickel and a second layer of gold overlaying said first layer of gold.

8. The printed circuit device according to claim 5, wherein said layer of nickel has a thickness of 50 to 300 microinches, said layer of palladium has a thickness of 4 to 30 microinches and said layer of gold has a thickness of 1 to 10 microinches.

9. The printed circuit device according to claim 6, wherein said layer of nickel has a thickness of 50 to 300 microinches and said layer of gold has a thickness of 20 to 40 microinches.

10. The printed circuit device according to claim 7, wherein said layer of nickel has a thickness of 50 to 300 microinches, said first layer of gold has a thickness of 20 to 40 microinches and said second layer of gold has a thickness of 5 to 30 microinches.

11. The printed circuit device according to claim 5, wherein said layers of nickel and palladium are formed by electroless plating and said layer of gold is soft gold formed by electrolytic or electroless plating.

12. The printed circuit device according to claim 6, wherein said layer of nickel formed by electroless plating and said layer of gold is hard gold formed by electrolytic plating.

13. The printed circuit device according to claim 7, wherein said layer of nickel is formed by electroless plating, said first layer of gold is hard gold formed by electrolytic plating and said second layer of gold is soft gold formed by electrolytic or electroless plating.

14. The printed circuit device according to claim 1, further including forming a layer of tin under said solder layer.

15. The printed circuit device according to claim 1, wherein said first set of conductors includes PIH/LGA pads, LGA pads and SMT pads, said second set of conductors are wiring traces and said third set of conductors are edge connectors.

* * * * *